(12) United States Patent
Olesiewicz et al.

(10) Patent No.: US 8,054,635 B2
(45) Date of Patent: Nov. 8, 2011

(54) TOOL-LESS MODULAR EXPANSION CARD CARRIER

(75) Inventors: Timothy W. Olesiewicz, Dublin, CA (US); Brett C. Ong, San Jose, CA (US); Robert Lajara, San Jose, CA (US)

(73) Assignee: Oracle America Inc., Redwood City, CA (US)

( * ) Notice: Subject to any disclaimer, the term of this patent is extended or adjusted under 35 U.S.C. 154(b) by 461 days.

(21) Appl. No.: 12/333,870

(22) Filed: Dec. 12, 2008

(65) Prior Publication Data

US 2010/0153608 A1 Jun. 17, 2010

(51) Int. Cl.
  *G06F 1/16* (2006.01)
(52) U.S. Cl. ....................................... 361/728; 710/303
(58) Field of Classification Search .................. 710/303; 361/728
See application file for complete search history.

(56) References Cited

U.S. PATENT DOCUMENTS

| 6,118,667 | A  | * | 9/2000  | Grosser et al. ............... 361/752 |
| 6,185,093 | B1 | * | 2/2001  | Moss ......................... 361/679.6 |
| 6,461,170 | B1 | * | 10/2002 | Oliphant et al. ............. 439/76.1 |
| 6,594,150 | B2 | * | 7/2003  | Creason et al. ............... 361/727 |
| 6,826,638 | B1 | * | 11/2004 | Jaggers et al. ................ 710/300 |
| 7,440,262 | B2 | * | 10/2008 | Coffey et al. ................. 361/627 |
| 7,599,183 | B2 | * | 10/2009 | Dittus et al. .................. 361/695 |
| 7,663,889 | B2 | * | 2/2010  | Lajara et al. ................. 361/759 |
| 2008/0094794 | A1 | * | 4/2008 | Hass ............................ 361/685 |
| 2009/0122496 | A1 | * | 5/2009 | Nishimoto et al. ........... 361/728 |
| 2009/0141441 | A1 | * | 6/2009 | Ong et al. ................ 361/679.32 |
| 2009/0224640 | A1 | * | 9/2009 | Yang et al. ................. 312/223.2 |
| 2010/0027230 | A1 | * | 2/2010 | Wu et al. ...................... 361/801 |
| 2010/0134988 | A1 | * | 6/2010 | Zheng et al. .................. 361/756 |

* cited by examiner

*Primary Examiner* — Lisa Lea Edmonds
(74) *Attorney, Agent, or Firm* — Brooks Kushman P.C.

(57) ABSTRACT

A carrier for supporting an expansion card is disclosed herein. The expansion card is configured for connection to a server. The carrier includes a module that is configured to receive and removably retain the expansion card. The module is further configured to support the expansion card in a position that aligns the expansion card with a receiver in the server. The module is further configured to move with respect to the receiver to facilitate connection of the expansion card to the receiver.

18 Claims, 8 Drawing Sheets

TOOL-LESS MODULAR EXPANSION CARD CARRIER

BACKGROUND OF THE INVENTION

1. Field of the Invention

Embodiments of the invention disclosed herein relate to a carrier configured to support an expansion card and to facilitate connection of the expansion card with a server in a manner that does not require tools for attachment and in a manner that inhibits the expansion card from flexing.

2. Background Art

Computer equipment such as servers are configured to connect to expansion cards which may augment the capabilities of the server or other computer component. Expansion cards are frequently installed at a rear of the server. The server may be housed in a location that provides limited access to the rear of the server. For instance, a plurality of servers may be stored in a stacked orientation within a cabinet. It may be desirable to connect the expansion card to the server without removing the server from its housing. Accordingly, there may be limited room in which to manipulate the expansion card.

Furthermore, expansion cards may be delicate. The flexing of an expansion card as it is connected to a server may damage the expansion card. It is therefore desirable to align the expansion card with the slot or receiver on the server that is configured to receive the expansion card and also to orient the expansion card such that it is substantially parallel to the direction of insertion when inserting the expansion card. Furthermore, it is desirable to apply a force to the expansion card that is substantially parallel to the expansion card and the receiver to reduce the possibility of the expansion card flexing when it is connected to the server.

Because of the potentially cramped quarters in which the expansion card may be connected to the server, it is additionally desirable that the expansion card be attachable to the server without the need to use tools such as screwdrivers and screws. Embodiments of the invention disclosed herein address these and other problems.

SUMMARY OF THE INVENTION

Various embodiments of a carrier for supporting an expansion card that is configured for connection to a server are disclosed herein. In a first embodiment, the carrier comprises a module that is configured to receive and removably retain the expansion card. The module is further configured to support the expansion card in a position that aligns the expansion card with a receiver in the server. The module is further configured to move with respect to the receiver to facilitate connection of the expansion card to the receiver.

In an implementation of the first embodiment, the module defines a PCB slot to slidably receive the expansion card. In a variation of this implementation, the module defines a plurality of the PCB slots to slidably receive a plurality of the expansion cards. Each PCB slot is disposed within the module at a position that is configured to align with a respective one of a plurality of receivers in the server. In another variation of this implementation, the PCB slot is configured to support the expansion card in a position that is substantially parallel with the receiver. In a further variation, the module is further configured to slide along a surface of the server to facilitate connection of the expansion card with the receiver.

In another implementation of the first embodiment, the module is further configured to engage the expansion card in a snap-fit relationship. In a variation of this implementation, the expansion card has a notch and the module includes a PCB latch having a camming surface. The PCB latch is configured to engage the notch.

In another implementation of the first embodiment, the server has an alignment feature and the module is configured to engage the alignment feature to maintain an aligned orientation with respect to the receiver as the module moves towards the receiver. In a variation of this implementation, the alignment feature comprises a first mushroom standoff and the module further defines a first alignment slot that is configured to engage the first mushroom standoff. In a further variation, the server has a second mushroom standoff that is spaced apart from the first mushroom standoff. The module further defines a second alignment slot configured to engage the second mushroom standoff. The first alignment slot cooperates with the second alignment slot to maintain the module in an aligned orientation with respect to the receiver when the first alignment slot and the second alignment slot are respectively engaged with the first mushroom standoff and the second mushroom standoff as the module moves towards the receiver. In another variation, the module is further configured to engage the first mushroom standoff in a snap-fit manner such that when the expansion card is received within the module and when the expansion card is connected with the receiver, the module and the first mushroom standoff cooperate to prevent disconnection of the expansion card from the receiver.

In a variation of this implementation, the module includes a first docking latch having a first camming surface. The first docking latch is disposed proximate an end of the first alignment slot. The first camming surface is positioned to engage the first mushroom standoff when the first mushroom standoff reaches the end of the first alignment slot. The first docking latch is configured to engage the first mushroom standoff when the first mushroom standoff moves past an end of the first camming surface. In a variation, the first docking latch is positioned to engage the first mushroom standoff at substantially the same time that the expansion card connects with the receiver. In another variation, the module further includes a second docking latch having a second camming surface. The second docking latch is disposed proximate an end of the second alignment slot. The second camming surface is positioned to engage the second mushroom standoff when the second mushroom standoff reaches the end of the second alignment slot. The second docking latch is configured to engage the second mushroom standoff when the second mushroom standoff moves past an end of the second camming surface.

In a further variation, the module further includes a first projection connected to the first docking latch. The first projection projects outwardly from the module. The module further includes a second projection connected to the second docking latch. The second projection projects outwardly from the module. The first projection and the second projection are configured to retract the first docking latch and the second docking latch, respectively, when the first projection and the second projection are pressed. In a variation of this implementation, the first projection and the second projection project outwardly from the module in substantially opposite directions. In another implementation of the first embodiment, the module comprises plastic.

In another implementation of the first embodiment, the module is configured to slide along a surface of the server. The module is further configured to connect the expansion card to the receiver as the module slides towards the receiver along the surface of the server.

In a second embodiment, the carrier comprises a first module that is configured to receive and removably retain the expansion card. The first module is further configured to support the expansion card in a position that aligns the expansion card with a receiver in the server. The first module is further configured to move with respect to the receiver to facilitate connection of the expansion card to the receiver. The first module has an outer surface that is configured to engage a second module.

In a third embodiment, a carrier for supporting an expansion card is disclosed. The expansion card defines a notch and is configured for connection to a server. The server has a surface and first and second mushroom standoffs attached to the surface. In this third embodiment, the carrier comprises a module having a PCB slot to receive and retain the expansion card. The module has a PCB latch having a camming surface. The latch is configured to engage the notch of the expansion card. The PCB slot is disposed to support the expansion card in alignment with a receiver in the server. The PCB slot is configured to support the expansion card in an orientation that is substantially parallel to the receiver. The module is further configured to slide along the surface of the server. The module further has first and second alignment slots that are configured to respectively engage the first and the second mushroom standoffs. The module further has first and second docking latches that are disposed to engage the first and the second mushroom standoffs, respectively. The module is configured to facilitate connection of the expansion card to the receiver.

BRIEF DESCRIPTION OF THE DRAWINGS

The description herein makes reference to the accompanying drawings wherein like reference numerals refer to like parts throughout the several views, and in which.

DETAILED DESCRIPTION OF THE PREFERRED EMBODIMENT(S)

Detailed embodiments of the present invention are disclosed herein; however, it is to be understood that the disclosed embodiments are merely exemplary of the invention that may be embodied in various and alternative forms. The figures are not necessarily drawn to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

Figure 1:
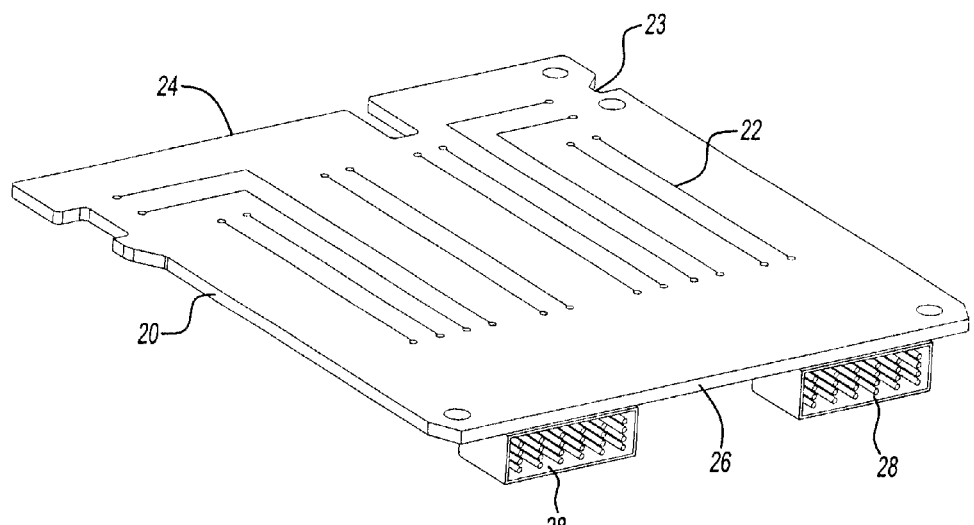
FIG. 1 is a perspective view illustrating an expansion card configured for connection to a server.

With respect to FIG. 1, an expansion card 20 is illustrated in perspective view. In the illustrated embodiment, expansion card 20, also known as a daughter card, comprises a printed circuit board made of a fiberglass material having copper traces or etchings 22 across an upper and lower surface of expansion card 20 configured to enhance the computing capabilities of a server or other computer device to which expansion card 20 is attached. Being relatively thin compared with its overall length, and having a high density of etchings 22 across its upper and lower surfaces, expansion card 20 may be relatively delicate and susceptible to malfunction if flexed. Expansion card 20 has a longitudinal axis extending through expansion card 20 from a first end 24 to a second end 26. First end 24 is configured for insertion into a receiver or port on a server, discussed below. Second end 26 includes a plurality of connectors 28 configured to receive plugs or other compatible connectors from computer-related equipment.

Figure 2:
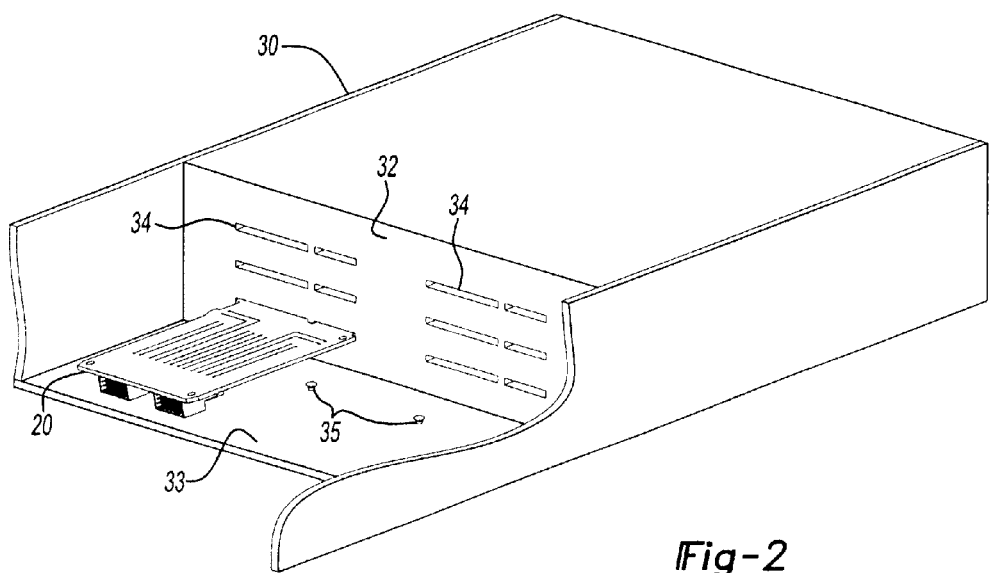
FIG. 2 is a perspective view illustrating the expansion card of FIG. 1 connected in a conventional manner to a server.

With respect to FIG. 2, a server 30 is illustrated in a cut away fashion. A cover has been removed from a back portion of server 30 to provide an operator with access to disk back plane 32 and server bottom surface 33. Disk back plane 32 has a plurality of receivers 34 configured to receive first end 24 of expansion card 20. Disposed on server bottom surface 33 are a plurality of mushroom standoffs 35. Mushroom standoffs 35 are cylindrical members attached to server bottom surface 33 and projecting upwardly therefrom in a direction substantially perpendicular thereto. Mushroom standoffs 35 include a mushroom standoff base portion 37 and a mushroom standoff lip portion 39 (see FIGS. 2, 8 and 14). Mushroom standoffs 35 permit the alignment and the securing of bodies, mechanisms, and devices to server bottom surface 33. In other embodiments, other alignment features may be present including, but not limited to, rails, grooves, and channels. Although mushroom standoffs 35 are described in detail in this disclosure, it should be understood that any alignment and/or securing feature may be used in its stead without departing from the teachings of the present invention.

Expansion card 20 is illustrated in a connected state with one of the receivers 34 of server 30. Receivers 34 are configured to receive expansion card 20 while expansion 20 is oriented substantially perpendicularly to back plane 32. Examples of receivers 34 include, but are not limited to, edge card connectors such as the EdgeLine™ 12.5 Gbps Edge Card Connector, having the Part No. 0764211000; and the EXTreme PowerEdge™ Connector, Part No. 0457190001 and the iCool™ VRM Connector, Part No. 0877861002. If expansion card 20 is held at an angle other than substantially perpendicular to back plane 32 when inserted into receiver 34, the force applied by the user inserting expansion card 20 into receiver 34 may cause expansion card 20 to flex which may break or dislodge some or all of etchings 22 resulting in a malfunction of expansion card 20. If server 30 is disposed at the bottom of a cabinet configured to hold a plurality of servers, a user may have to bend over the plurality of servers 30 and reach down in order to insert expansion card 20. Such an awkward angle of insertion and limited access may cause the user to apply a force to expansion card 20 that is in a direction that is other than perpendicular to disk back plane 32 which may cause flexure of expansion card 20 and the potential for malfunction. It is desirable to have a mechanism or structure which holds expansion card 20 substantially perpendicularly to disk back plane 32 and receiver 34 as expansion card 20 is connected to receiver 34. Furthermore, due to the potentially inaccessible environments in which expansion cards such as expansion card 20 may be attached to server 30, it is desirable that such a mechanism or structure be operable to connect expansion card 20 to server 30 without the need for tools, for example, screw drivers, or fasteners.

Figure 3:
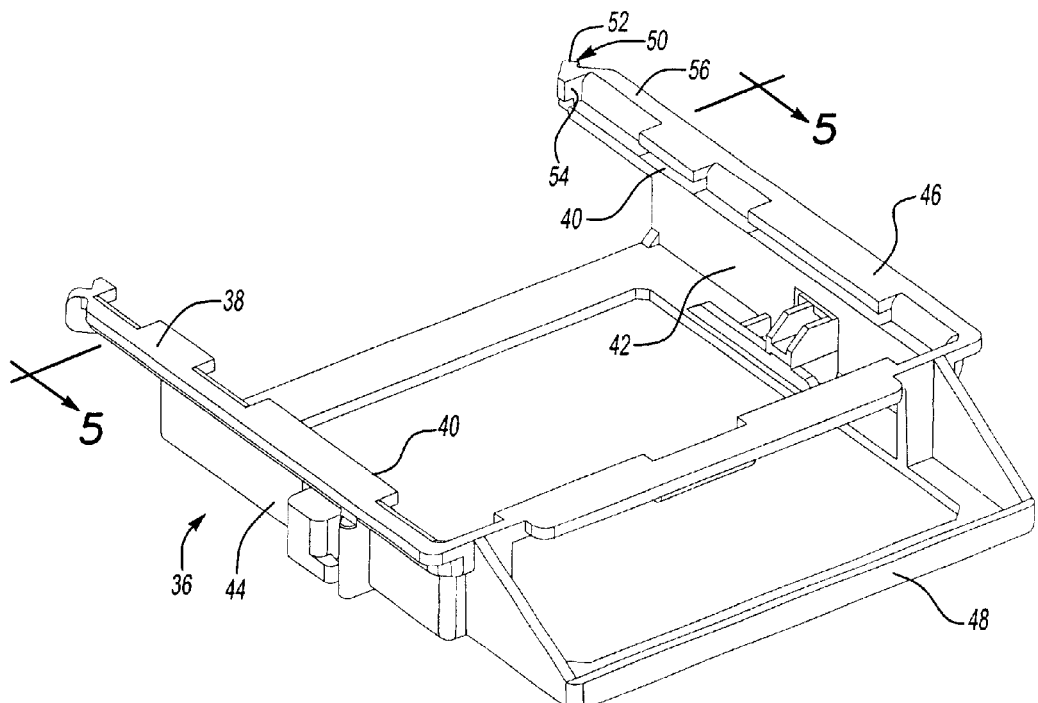
FIG. 3 is a perspective view illustrating an embodiment of a carrier made in accordance with the teachings of the present invention.

With respect to FIG. 3, a carrier 36 is illustrated. Carrier 36 has been made in accordance with the teachings of the present invention and is configured to receive expansion card 20 and to facilitate the connection of expansion card 20 to receiver 34. Carrier 36 comprises a module 38 having a PCB slot 40 that is configured to slidably receive expansion card 20. As used herein, the term "module" refers to a case or container for holding an expansion card including, but not limited, printed circuit boards containing a computer program. PCB slot 40 is defined in an upper portion of first and second walls 42, 44 of module 38. Upper portion 46 of module 38 has an open, picture-frame-type configuration to reduce the material cost for producing module 38. In other embodiments, discussed below, upper portion 46 of module 38 may be closed. Similarly, lower portion 48 of module 38 is also open to reduce the material costs associated with manufacturing module 38. In other embodiments, lower portion 48 may have a closed or solid configuration.

Module 38 further includes a PCB latch 50 having a thumb portion 52, an engagement portion 54, and a neck portion 56. In some embodiments, module 38 comprises a one-piece integral unit which may be fabricated through the process of injection molding. In other embodiments, module 38 may be assembled from a plurality of individual components and secured to one another through the use of mechanical fasteners, such as threaded fasteners, or adhesives such as epoxy or through the use of any other method, mechanism, or combination of methods and mechanisms effective for assembling discrete parts. In some embodiments, module 38 may comprise plastic.

Neck portion 56 may be configured to flex in a direction that is coplanar with upper portion 46. When in its design position, engagement portion 54 longitudinally obstructs access to PCB slot 40. A user may apply force to thumb portion 52 to flex PCB latch 50 in a direction that moves engagement portion 54 out of longitudinal obstruction of PCB slot 40. A user may flex PCB latch 50 by applying force with the user's thumb or other finger to thumb portion 52 in a direction away from second wall 44. Expansion card 20 includes a notch 23 configured to receive engagement portion 54.

In the embodiment illustrated in FIG. 3, PCB slot 40 is defined at a location in first and second walls 42, 44 that is spaced apart from a bottom side of lower portion 48 by a distance that corresponds to a vertical distance from server bottom surface 33 to receiver 34. In this manner, when expansion card 20 is received within PCB slot 40 and carrier 36 is placed on server bottom surface 33, expansion card 20 will be positioned at an appropriate height for insertion into receiver 34.

Figure 4:
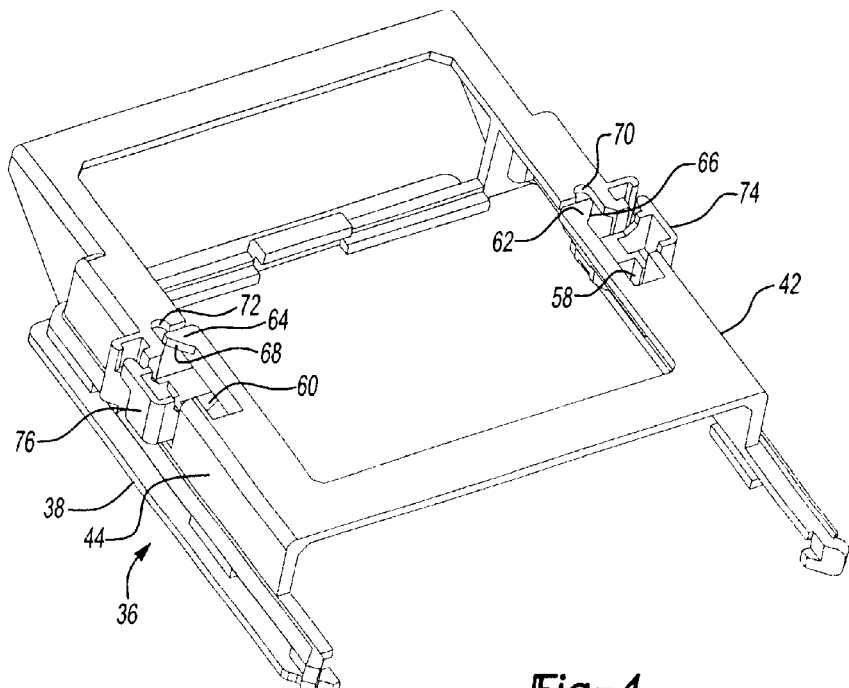
FIG. 4 is a perspective view illustrating an underside of the carrier of FIG. 3.

With respect to FIG. 4, a perspective view of an underside of module 38 of FIG. 3 is illustrated. As illustrated in this view, the underside of module 38 is generally smooth to facilitate a sliding engagement with server bottom surface 33. In this view, first and second alignment slots 58 and 60 are illustrated. First and second alignment slots 58, 60 are configured to engage mushroom standoffs 35. At respective ends of first and second alignment slots 58, 60, first and second docking latches 62, 64 are disposed. When module 38 has been aligned with mushroom standoffs 35 such that a mushroom standoff 35 is received within first alignment slot 58 and a second mushroom standoff 35 is received within second alignment slot 60, module 38 may be slid along server bottom surface 33 towards receiver 34. As module 38 is slid towards receiver 34 along server bottom surface 33, mushroom standoffs 35 move towards the rear of module 38. First and second docking latches 62, 64 include first and second camming surfaces 66 and 68. When mushroom standoffs 35 encounter first and second camming surfaces 66, 68, mushroom standoffs 35 exert a force on first and second docking latches 62, 64 causing first and second docking latches 62, 64 to flex inwardly towards one another. When module 38 is pushed further towards receiver 34, mushroom standoffs 35 move past respective ends of first and second camming surfaces 66, 68 and into first and second mushroom standoff receiving portions 70, 72 which are configured to engage the upper lip of mushroom standoff 35 and thus fixedly secure module 38 to server bottom surface 33 in a snap-fit manner. First and second alignment slots 58, 60 and first and second mushroom standoff receiving portions 70, 72 are disposed at a longitudinal location along lower portion 48 of module 38 such that module 38 snaps into a snap-fit position at the same time that first end 24 of expansion card 20 connects with receiver 34.

Module 38 also includes first and second projections 74, 76 which are connected, respectively to first and second docking latches 62, 64. When an inwardly directed force is applied to first and second projections 74, 76, first and second docking latches 62, 64 flex inwardly pushing first and second camming surfaces 66, 68 out of obstruction with mushroom standoffs 35, thus allowing module 38 to move in a direction away from receiver 38 to affect a disconnection of expansion card 20 from receiver 34.

Figure 5:
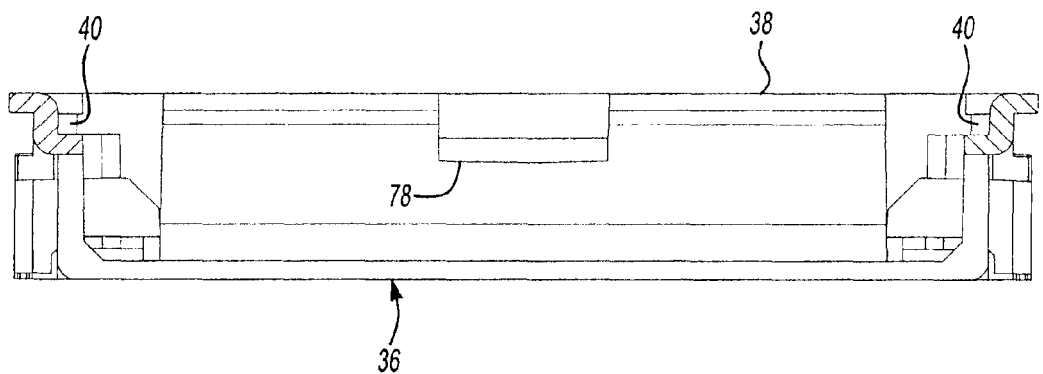
FIG. 5 is a cross-sectional view of the carrier of FIG. 3 taken along the line 5-5 of FIG. 3.

With respect to FIG. 5, a cross-sectional view taken along the lines 5-5 of FIG. 3 is illustrated. In this view, PCB slot 40 can be seen. In this embodiment, PCB slot 40 is defined within a rear wall 78. PCB slot 40 in rear wall 78 is disposed to receive second end 26 of expansion card 20. By gripping expansion card 20 on three sides, module 38 can provide greater resistance to twisting and/or flexure of expansion card 20 as it is inserted into receiver 34. In other embodiments, module 38 may not include a rear wall 78. In other embodiments, rear wall 78 may extend from first wall 42 to second wall 44 or have any suitable length.

Figure 6:
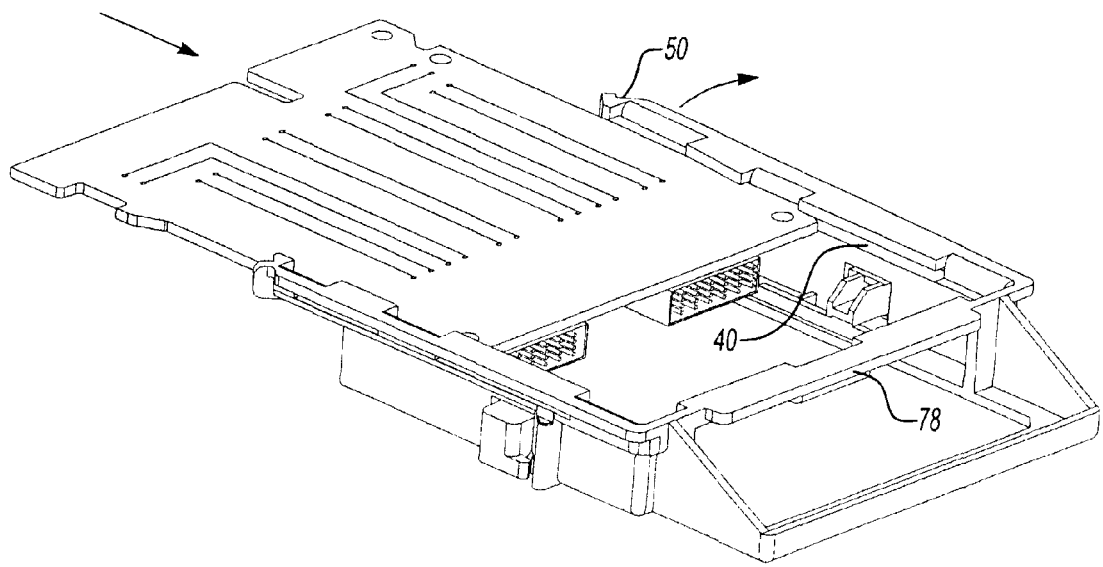
FIGS. 6-7 are perspective views illustrating the connection of the expansion card of FIG. 1 to the carrier of FIG. 3 to form an assembly.

With respect to FIG. 6, PCB latch 50 has been pulled back exposing PCB slot 40. Expansion card 20 has been inserted into PCB slot 40 and is sliding towards rear wall 78.

Figure 7:
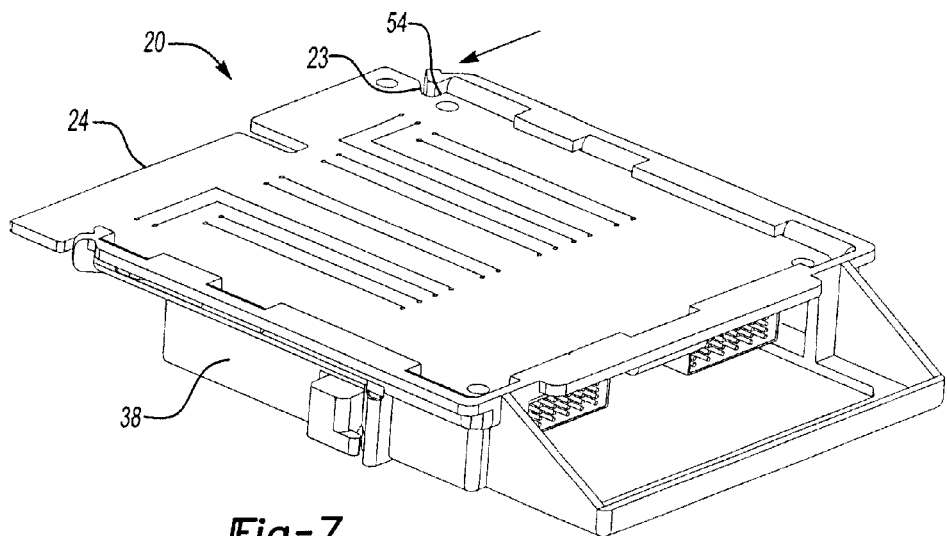

With respect to FIG. 7, expansion card 20 has been fully inserted into PCB slot 40. When fully inserted, notch 23 of expansion card 20 comes into alignment with engagement portion 54 of PCB latch 50 which snaps back into it design position to engage notch 23 and retain expansion card 20 within module 38. When fully seated within module 38, first ends 24 protrudes forward of a front portion of module 38. This protrusion allows engagement between expansion card 20 and receiver 34.

Figure 8:
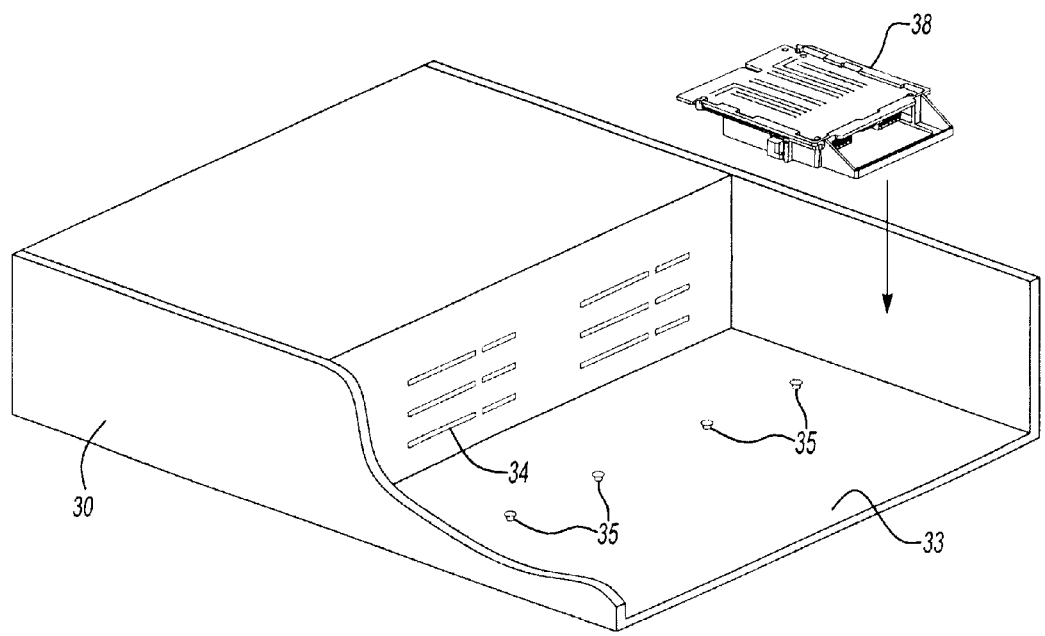
FIGS. 8-10 are perspective views illustrating connection of the assembly of FIG. 7 to the server illustrated in FIG. 2.
Figure 9:
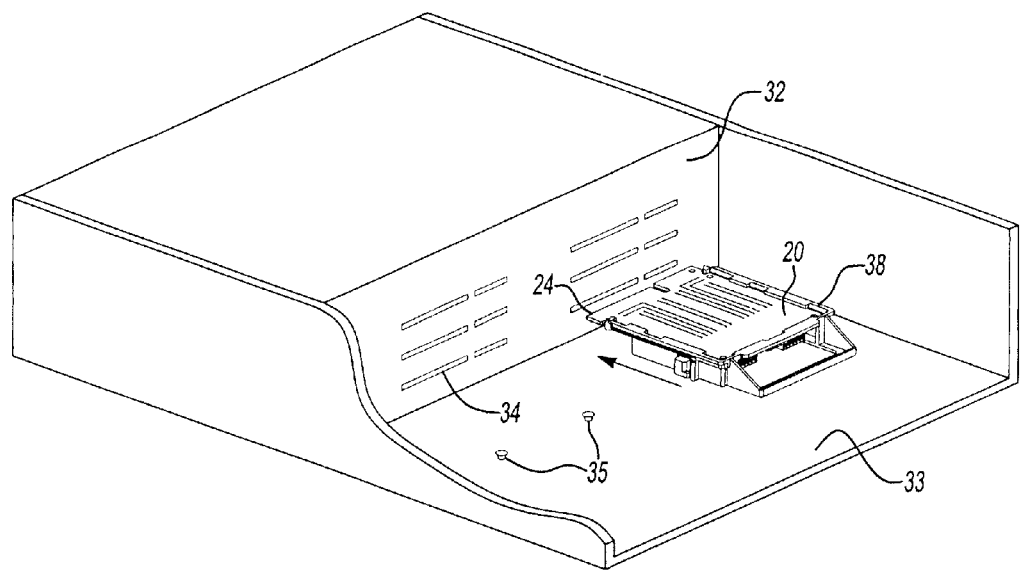
Figure 10:
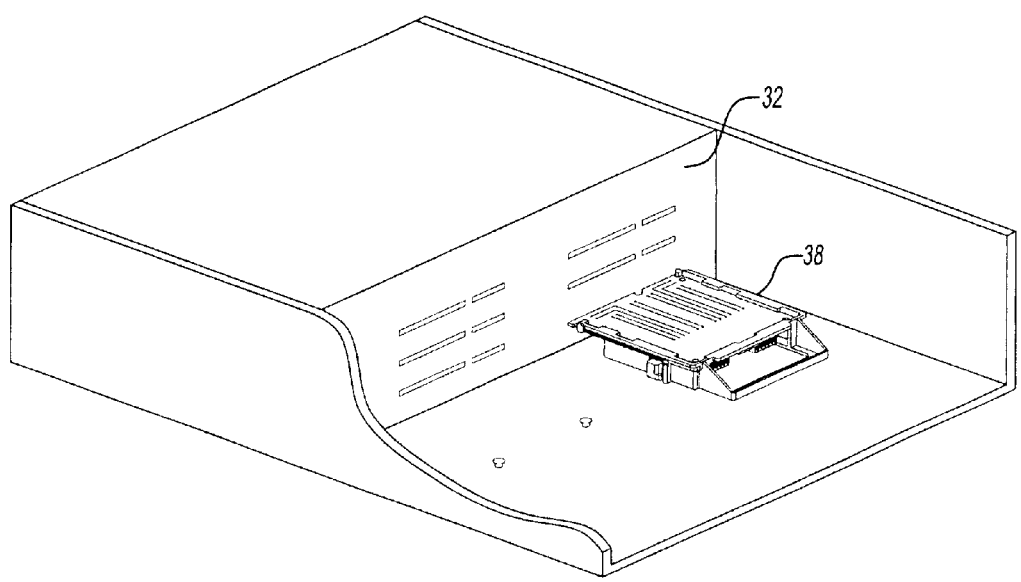

FIGS. 8-10 illustrate the connection of module 38 to server 30. First, as illustrated in FIG. 8, module 38 is aligned over two mushroom standoffs 35 disposed in front of an intended receiver 34. Module 38 may then be lowered onto server bottom surface 33.

With respect to FIG. 9, module 38 is aligned over mushroom standoffs 35 and positioned thereon such that mushrooms 35 are received within first and second alignment slots 58 and 60. Once so aligned, module 38 may be slid forward over server bottom surface 33 and along first and second alignment slots 58 towards disk back plane 32. As illustrated, with expansion card 20 seated in module 38, first end 24 is positioned at a height that aligns with intended receiver 34. Alignment of first and second alignment slots 58 and 60 together with mushroom standoffs 35 also ensure proper lateral alignment between expansion card 20 and receiver 34. In other embodiments, first and second alignment slots 58 and 60 may be long enough to receive two mushroom standoffs 35 each. In other embodiments of server 30, mushroom standoffs 35 may be positioned close enough together such that two mushroom standoffs 35 may fit within first and second alignment slots 58 and 60 of the illustrated embodiment. The use of additional mushroom standoffs in each alignment slot may further enhance alignment of module 38 with receiver 34.

With respect to FIG. 10, module 38 has been moved forward so it rests against disk back plane 32. In this position, first and second docking latches 62 have engaged mushroom standoffs 35 such that mushroom standoffs 35 are positioned within first and second mushroom standoff receiving portions 70, 72. First end 24 of expansion card 20 is seated within receiver 34 thus connecting expansion card 20 to server 30.

Figure 11:
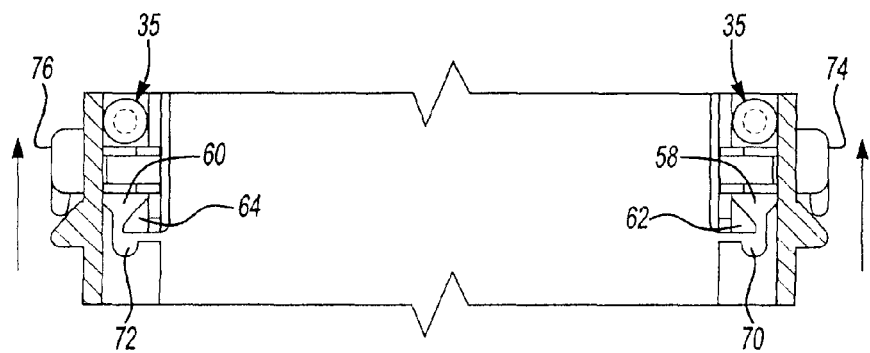
FIGS. 11-13 are fragmentary cross-sectional views illustrating a portion of the carrier of FIG. 3 as it is assembled to the server of FIG. 2.
Figure 12:
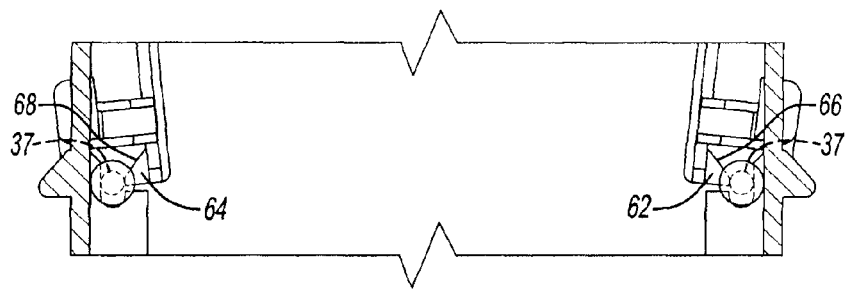
Figure 13:
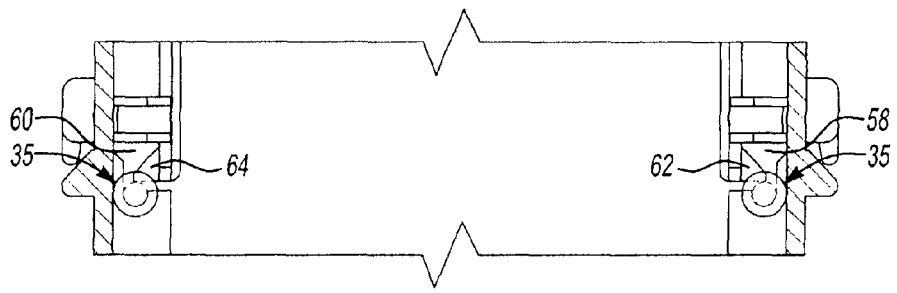

With respect to FIGS. 11-13, fragmentary, cross-sectional views from a perspective above module 38 and mushroom standoffs 35 illustrate the engagement between first and second docking latches 62 and 64 and mushroom standoffs 35. Mushroom standoffs 35 are disposed within first and second alignment slots 58, 60 prior to pushing module 38 towards disk back plane 32.

With respect to FIG. 12, module 38 has moved in a direction towards disk back plane 32 and mushroom standoff base portion 37 is engaged with first camming surface 66 of first docking latch 62 forcing first docking latch 62 to bend inwardly and allow mushroom standoff 35 to pass.

With respect to FIG. 13, module 38 has been moved to the position illustrated in FIG. 10. Mushroom standoff 35 has moved beyond an end of first camming surface 66 and first docking latch 62 has snapped back into its design position. Mushroom standoff 35 is disposed within first mushroom standoff receiving portion 70 and is obstructed from movement backwards along first alignment slot 58 by engagement between first docking latch 62 and mushroom standoff base portion 37.

Figure 14:
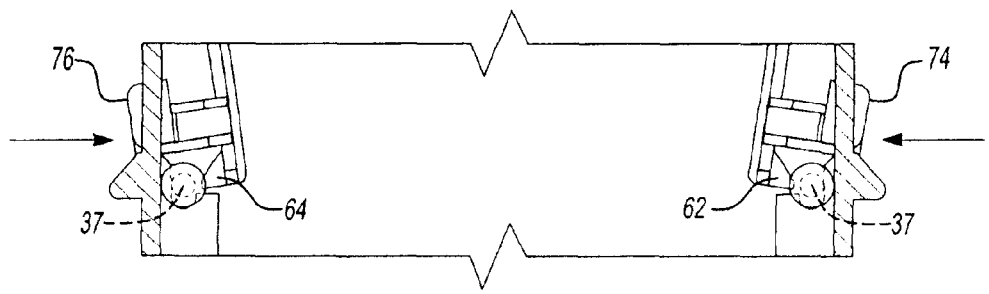
FIG. 14 is a fragmentary, cross-sectional view illustrating the disconnection of the carrier assembly of FIG. 13 from the server.

With respect to FIG. 14, a cross-sectional view taken across the line 14-14 of FIG. 13 is illustrated. In this view, the respective positions between lower surface 48 and mushroom standoff lip portion 39 are illustrated. Mushroom standoff lip portion 39 prevents module 38 from lifting up off of server bottom surface 33 by obstructing upward travel of lower portion 48. As illustrated in FIGS. 13 and 14, when first and second docking latches 62, 64 are engaged with mushroom standoffs 35, module 38 is obstructed from moving away from disk back plane 32 or from moving away from server bottom surface 33. In this manner, carrier 36 is configured to permit the alignment and the tool-less connection of expansion card 20 to receiver 34 in server 30 while reducing the risk of flexing expansion board 20.

Figure 15:
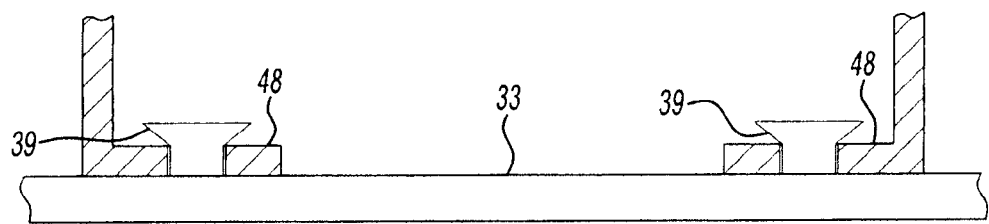
FIG. 15 is a cross-sectional view illustrating the connection between the carrier and the server.

With respect to FIG. 15, to remove module 38 from the position illustrated in FIG. 10, inward pressure may be applied to first and second projections 80, 82 causing first and second docking latches 62, 64 to flex inwardly and thus remove the obstruction between first and second docking latches 62, 64 and their respective mushroom standoffs 35. With first and second docking latches 62, 64 positioned as illustrated in FIG. 15, module 38 may be slid away from disk back plane 32 and expansion card 20 may be thusly removed from receiver 34. In this manner, carrier 36 is configured to permit the tool-less disconnection of expansion card 20 from receiver 34. In other embodiments, module 38 may not include first and second alignment slots 58 and 60. In other embodiments, module 38 may include first and second alignment slots 58 and 60 but may not include first and second docking latches 62 and 64. In still other embodiments, snap-fit configurations other than first and second docking latches 62, 64 may be employed. Similarly, snap-fit configurations for the removable connection of expansion card 20 to module 38 other than PCB latch 50 may also be employed.

Figure 16:
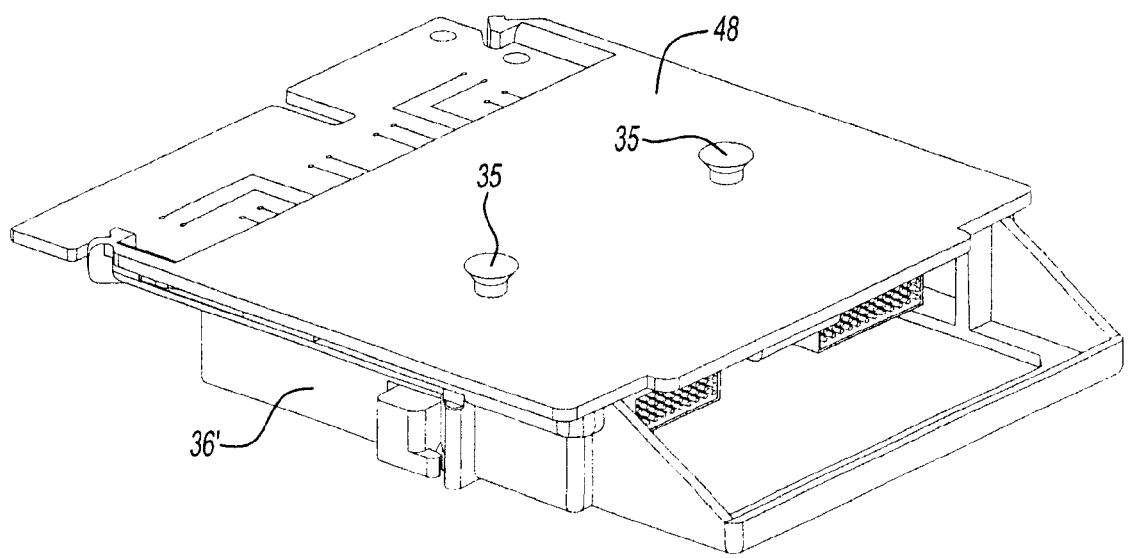
FIG. 16 is a perspective view illustrating an alternate embodiment of the carrier of FIG. 3.

With respect to FIG. 16, an alternate embodiment module 38' is illustrated. Carrier 36' has an upper portion 46 that, unlike the picture-frame arrangement of module 38 illustrated in FIG. 3, has a closed, solid configuration. Additionally, mushroom standoffs 35 have been affixed to upper portion 48 to permit a second carrier such as carrier 36 or 36' to be attached to upper portion 48 of module 38'. In this manner, multiple modules 38' may be stacked one on top of the other to permit multiple expansion cards 20 to be connected to vertically arranged receivers 34.

Figure 17:
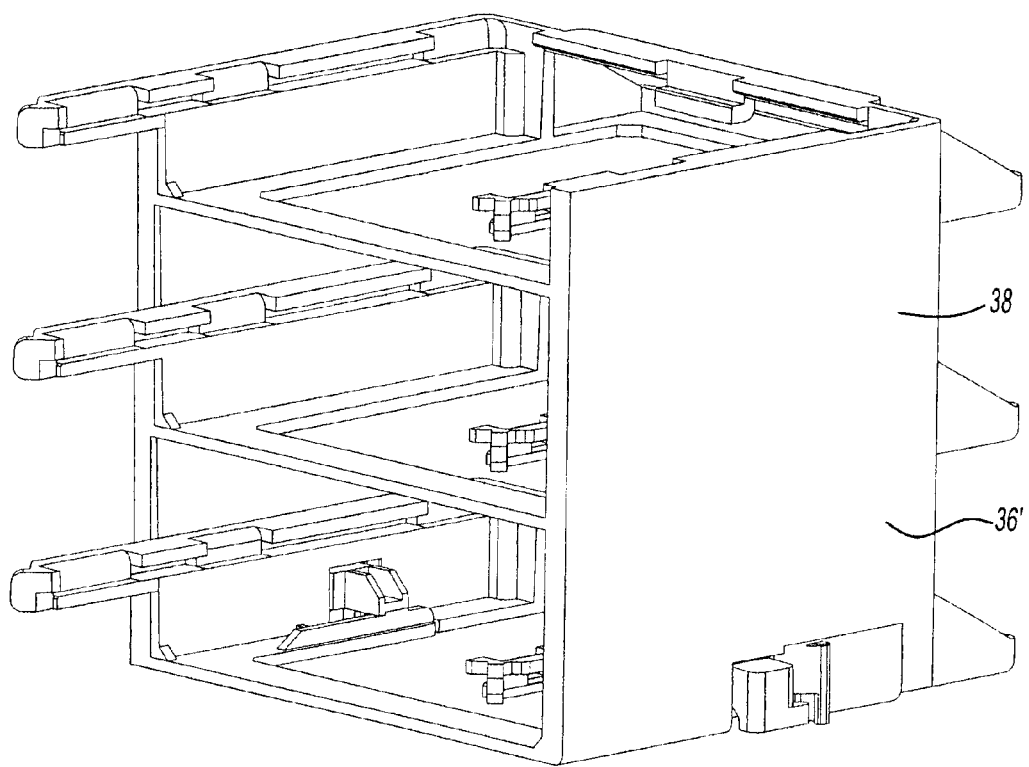
FIG. 17 illustrates another alternate embodiment of the carrier of FIG. 3.

Carrier 36" illustrated in FIG. 17, is yet another embodiment of carrier 36. Carrier 36" includes a vertically elongated module 38 having a plurality of PCB slots 40 to receive a plurality of expansion cards 20. Carrier 36" not only permits the stacking of multiple expansion cards 20, but also permits a substantially simultaneous connection of multiple expansion cards 20 into respective receivers 34.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A carrier for supporting an expansion card, the expansion card being configured for connection to a server, the carrier comprising:
    a module configured to receive and removably retain the expansion card, the module being further configured to support the expansion card in a position that aligns the expansion card with a receiver in the server, the module being further configured to move with respect to the receiver to facilitate connection of the expansion card to the receiver, wherein the module defines a plurality of PCB slots that slidably receive a plurality of expansion cards, each PCB slot being disposed within the module at a position that is configured to align with a respective one of a plurality of receivers in the server.

2. The carrier of claim 1 wherein at least one of the PCB slots is configured to support the expansion card in a position that is substantially parallel with the receiver.

3. The carrier of claim 2 wherein the module is further configured to slide along a surface of the server to facilitate connection of the expansion card with the receiver.

4. A carrier for supporting an expansion card, the expansion card being configured for connection to a server, the carrier comprising:
    a module configured to receive and removably retain the expansion card, the module being further configured to support the expansion card in a position that aligns the expansion card with a receiver in the server, the module being further configured to move with respect to the receiver to facilitate connection of the expansion card to the receiver, wherein the module defines a plurality of PCB slots that slidably receive a plurality of expansion cards, each PCB slot being disposed within the module at a position that is configured to align with a respective one of a plurality of receivers in the server, wherein the module is further configured to engage the expansion card in a snap-fit relationship.

5. The carrier of claim 4 wherein the expansion card has a notch and the module includes a PCB latch having a camming surface, the PCB latch being configured to engage the notch.

6. A carrier for supporting an expansion card, the expansion card being configured for connection to a server, the carrier comprising:
a module configured to receive and removably retain the expansion card, the module being further configured to support the expansion card in a position that aligns the expansion card with a receiver in the server, the module being further configured to move with respect to the receiver to facilitate connection of the expansion card to the receiver, wherein the module defines a plurality of PCB slots that slidably receive a plurality of expansion cards, each PCB slot being disposed within the module at a position that is configured to align with a respective one of a plurality of receivers in the server, wherein the server has an alignment feature, and wherein the module is configured to engage the alignment feature to maintain an aligned orientation with respect to the receiver as the module moves towards the receiver.

7. The carrier of claim 6 wherein the alignment feature comprises a first mushroom standoff and the module further defines a first alignment slot configured to engage the first mushroom standoff.

8. The carrier of claim 7 wherein the server has a second mushroom standoff spaced apart from the first mushroom standoff and the module further defines a second alignment slot configured to engage the second mushroom standoff, wherein the first alignment slot cooperates with the second alignment slot to maintain the module in an aligned orientation with respect to the receiver when the first alignment slot and the second alignment slot are respectively engaged with the first mushroom standoff as the second mushroom standoff as the module moves towards the receiver.

9. The carrier of claim 7 wherein the module is further configured to engage the first mushroom standoff in a snap-fit manner such that when the expansion card is received within the module and the expansion card is connected with the receiver, the module and the first mushroom standoff cooperate to prevent disconnection of the expansion card from the receiver.

10. The carrier of claim 9 wherein the module includes a first docking latch having a first camming surface, the first docking latch being disposed proximate an end of the first alignment slot and the first camming surface being positioned to engage the first mushroom standoff when the first mushroom standoff reaches the end of the first alignment slot, wherein the first docking latch is configured to engage the first mushroom standoff when the first mushroom standoff moves past an end of the first camming surface.

11. The carrier of claim 10 wherein the first docking latch is positioned to engage the first mushroom standoff at substantially the same time that the expansion card connects with the receiver.

12. The carrier of claim 10 wherein the module further includes a second docking latch having a second camming surface, the second docking latch being disposed proximate an end of the second alignment slot, the second camming surface being positioned to engage the second mushroom standoff when the second mushroom standoff reaches the end of the second alignment slot, the second docking latch being configured to engage the second mushroom standoff when the second mushroom standoff moves past an end of the second camming surface.

13. The carrier of claim 12 wherein the module further includes a first projection connected to the first docking latch, the first projection projecting outwardly from the module, the module further including a second projection connected to the second docking latch, the second projection projecting outwardly from the module, the first projection and the second projection being configured to retract the first docking latch and the second docking latch, respectively, when the first projection and the second projection are pressed.

14. The carrier of claim 13 wherein the first projection and the second projection project outwardly from the module in substantially opposite directions.

15. The carrier of claim 1 wherein the module comprises plastic.

16. The carrier of claim 1 wherein the module is configured to slide along a surface of the server and wherein the module is further configured to connect the expansion card to the receiver as the module slides towards the receiver along the surface of the server.

17. A carrier for supporting an expansion card, the expansion card being configured for connection to a server, the carrier comprising:
a first module configured to receive and removably retain the expansion card, the first module being further configured to support the expansion card in a position that aligns the expansion card with a receiver in the server, the first module being further configured to move with respect to the receiver to facilitate connection of the expansion card to the receiver, wherein the first module has an outer surface configured to engage a second module.

18. A carrier for supporting an expansion card, the expansion card defining a notch and being configured for connection to a server, the server having a surface and first and second mushroom standoffs attached to the surface, the carrier comprising:
a module having a PCB slot to receive and retain the expansion card, the module having a PCB latch having a camming surface, the latch being configured to engage the notch of the expansion card, the PCB slot being disposed to support the expansion card in alignment with a receiver in the server, the PCB slot being configured to support the expansion card in an orientation that is substantially parallel to the receiver, the module being further configured to slide along the surface of the server, the module further having first and second alignment slots configured to respectively engage the first and the second mushroom standoffs, the module further having first and second docking latches disposed to engage the first and the second mushroom standoffs respectively, the module being configured to facilitate connection of the expansion card to the receiver.

* * * * *